United States Patent [19]

LaBerge et al.

[11] Patent Number: 4,532,517
[45] Date of Patent: Jul. 30, 1985

[54] CYCLIC REDUNDANCY CHECK MONITOR FOR MICROWAVE LANDING SYSTEM BEAM STEERING UNIT

[75] Inventors: Edward F. C. LaBerge; Robert K. Calzetta, both of Baltimore, Md.

[73] Assignee: Allied Corporation, Morristown, N.J.

[21] Appl. No.: 470,352

[22] Filed: Feb. 28, 1983

[51] Int. Cl.³ .......................... H01Q 3/22; H01Q 3/24; H01Q 3/26
[52] U.S. Cl. .................................... 343/372; 343/377; 343/17.7
[58] Field of Search ............... 343/368, 372, 377, 17.7; 371/37

[56] References Cited

U.S. PATENT DOCUMENTS 4,065,771  12/1977  Gulick et al. ..................... 343/368
4,368,533  1/1983  Kojima ............................ 371/37

OTHER PUBLICATIONS

"Cyclic Codes for Error Detection" by Peterson & Brown Proc. IRE, Jan. 1961, pp. 228-235.

*Primary Examiner*—Theodore M. Blum
*Attorney, Agent, or Firm*—Bruce L. Lamb

[57] ABSTRACT

In a microwave landing system the individual words of a train of command words generated by the antenna beam steering unit are applied to a polynomial generator where each is, seriatim, summed with a polynomial check word generated in a previous operation. The result is shifted once toward the most significant bit to increase the degree of the resultant polynomial. Division by a predetermined generator polynomial is accomplished and the remainder is stored as the check word to be used in the next to follow operation. The check word polynomials are compared at preset intervals with stored check words to monitor the train of command words.

4 Claims, 5 Drawing Figures

CYCLIC REDUNDANCY CHECK MONITOR FOR MICROWAVE LANDING SYSTEM BEAM STEERING UNIT

BACKGROUND OF THE INVENTION

This invention relates to a cyclic redundancy check monitor for the microwave landing system beam steering unit and more particularly for checking the accuracy of a series of digital command signals sent to the azimuth or elevation antenna phase shifters for such microwave landing system.

The microwave landing system (MLS) is a new international standard non-visual approach and landing system for aircraft. It consists of ground equipment disposed at airports and comprised of an azimuth antenna which sweeps a fan-shaped antenna beam from a predetermined position to and fro through a predetermined segment of azimuth and an elevation antenna which sweeps a second fan-shaped antenna beam up and down through a predetermined segment of elevation angle from a fixed predetermined point. Distance measuring equipment is located at a third fixed predetermined point, all of such points being located usually in close proximity to one another within the aircraft landing area.

An aircraft carries airborne microwave landing system equipment which includes means for receiving the signals transmitted by the ground equipment. In addition to distance measuring equipment which determines the distance to a specified ground point by conventional methods, the airborne MLS equipment includes means to separately receive and decode to and fro or up and down scanning beams transmitted from the ground system to derive the azimuth and elevation angles of the aircraft with respect to the known ground points. By these means an aircraft within range of the ground MLS equipment can actually determine its position in three dimensions. The accuracy of the system is such as to admit the aircraft to maneuver with great safety during periods of reduced visibility.

Precise control of each ground MLS transmitted antenna beam position during its to and fro or up and down scan is maintained by a component of the system ground equipment known as a beam steering unit (BSU). Briefly, each fan-shaped beam transmitted by the ground equipment is radiated from an electronically steerable phased array antenna, an azimuth antenna for the azimuth beam and an elevation antenna for the elevation beam. The actual angular position of a beam in space is controlled in a known manner by the setting of phase shifters associated with the antenna. These phase shifters are preferably digitally controlled. The BSU thus generates a cyclic series or train of digital command words which are applied to the phase shifters to cause the beams to scan to and fro or up and down as appropriate.

Perhaps the most critical characteristic of the microwave landing system ground equipment is the high integrity required to satisfy the guidance needs of aircraft within the airport approach and landing zones, such aircraft being entirely dependent on microwave landing system guidance. The integrity required places great importance on internal monitoring of the control signals of all ground system functions so that fault conditions can be quickly detected and isolated.

SUMMARY OF THE INVENTION

The present invention is a cyclic redundancy check monitor used in a microwave landing system for monitoring the cyclic train of digital command words normally generated by the beam steering unit and applied, as appropriate, to the azimuth antenna or elevation antenna to cause the antenna beam to scan through the guidance zones. The command words, in addition to being applied to the antenna phase shifters, are subject to a cyclic redundancy check to insure that the beam steering unit output for each beam scan corresponds exactly to the sequence of command words which has been predetermined to produce the desired beam motion.

The cyclic redundancy check involves algebraic methods which have heretofore been used to verify the accuracy of digital data messages. The command word to be checked is applied to a polynomial generator where the command word is added, modulo 2, to the result of a previous check operation. This addition, which is performed by Exclusive OR gates, is not a true binary addition. The sum is shifted once toward the most significant bit. If a carry bit is present, a feedback term is added (modulo 2) to the shifted sum to accomplish division of such sum by a predetermined generator polynomial. The remainder of such division is stored for the following check operation.

After N such operations, the accumulator should contain a check word which corresponds exactly to a predetermined check word which is known by virtue of the fact that the desired sequence of command word outputs of the beam steering unit is known. If, at the end of said N operations, the accumulator content does not match the check word, the beam steering unit has generated an erroneous output at some time during the production of the N group of command words. The mismatch is detected, a fault is signaled and the monitor is held in the fault mode. Otherwise operation continues through a second N operations, and so forth, with a new check word being called up from storage for comparison with the accumulator content at the end of each such N operations until the entire beam scan is completed, whereupon all elements are reset to repeat the beam scan cycle.

PREFERRED EMBODIMENT OF THE INVENTION

Figure 1:
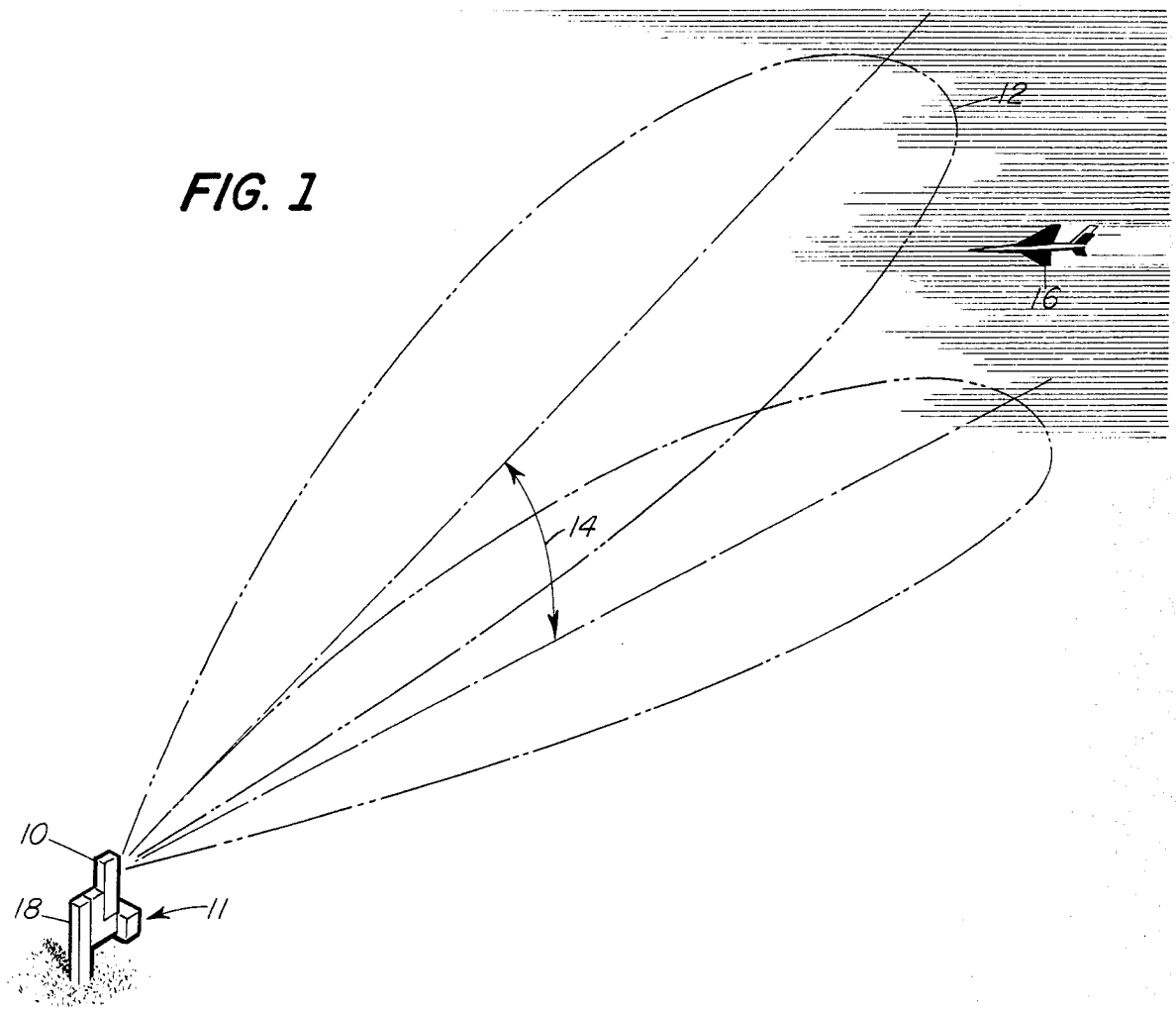
FIG. 1 shows a microwave landing system elevation antenna beam scanning the elevation guidance zone.

Known microwave landing system equipment includes, among other equipment, an elevation antenna as shown as item 10 of FIG. 1, reference to which figure should now be made. Here the fan-shaped antenna beam 12 is scanned up and down at a constant rate through, for example, an elevation angle 14. As known to those skilled, beam 12 is scanned at a rate and direction consistent with internationally established conventions. An aircraft 16, equipped with microwave landing system airborne equipment, recognizes beam 12 as it sweeps past the aircraft and determines the time between the up and down passages of the beam. The time measured between up and down passages of the beam, together with previously stored knowledge of the internationally agreed signal format enables calculation of the aircraft elevation angle with respect to the antenna position. The antenna beam is controlled by a control unit 18.

As described in greater detail in U.S. Pat. No. 3,999,182 issued Dec. 21, 1976 to Moeller et al. for "Phased Array Antenna with Coarse/Fine Electronic Scanning for Ultra-Low Beam Granularity" and as shown broadly in FIG. 2, elevation antenna 10 is normally an electronically scanned linear phased array consisting generally of an even number of antenna elements, here representative elements indicated as 10a through 10n. The antenna control unit 18 comprises a microwave generator 20 which supplies the r.f. carrier for the antenna and delivers this carrier to a modulator 22. Modulator 22 impresses station identification and other information desired to be transmitted by this beam upon the carrier, which information it receives from a data code generator 24. The modulated carrier is switched by antenna switch (25) to the data antenna 11. After the data has been radiated, the now unmodulated carrier is switched to a power divider 26 which proportions the carrier power to a group of phase shifters 28a through 28n. These phase shifters control the direction at which a beam is radiated from antenna array 10 in accordance with the signal received via digital data bus 30a/30b from a beam steering unit 30. Data bus 30a/30b contains two groups, of four separate lines each, one of which groups 30a carries a four-bit command signal to those phase shifters 28 servicing the antenna elements located on one side of the center of the array (positive) and the other which group 30b, carries a four-bit command signal to the phase shifters 28 serving the antenna elements 10 located on opposite side of the center of the array (negative). Phase shifters 28a–28n are digitally controlled to alter the phase of the carrier supplied thereto in discrete amounts determined by the value of the digital signal on data bus 30a/30b.

A synchronizer 34 controls the timing of operation of all the MLS components and provides signals at line 34a to control components of the system ground equipment not shown in the drawings and signals at lines 34b, 34c and 34d to control data generator 24, beam steering unit 31 and antenna switch 25 as known to those skilled in the art.

A typical 8-bit phase shifter command word of the beam steering unit consists of two 4-bit commands, one 4-bit command being applied via data bus 30a to the phase shifter 28 associated with an antenna element 10 positioned on the positive side of the array and the other 4-bit command being applied via data bus 30b to the phase shifter 28 associated with a symmetrically positioned antenna element on the negative side of the array. The digits of the positive command are arbitrarily designated as P3, P2, P1 and P∅, the P3 bit being the most significant bit. In like manner the bits of the negative command are arbitrarily designated as N3, N2, N1 and N∅, the N3 bit being the most significant bit. Taking the 8-bit command word as a whole, the P3 bit is designated the most significant bit and the N∅ bit is designated the least significant bit.

In one specific embodiment of the present invention the elevation antenna array is comprised of nineteen pairs of radiating elements with a like number of phase shifters. As described in said U.S. Pat. No. 3,999,182 a command word necessary to steer the antenna beam through a coarse step, equal to 0.262 degrees in the specific embodiment, is computed for each symmetrically positioned pair of antenna elements. These command words are applied to the phase shifters pair by pair in predetermined sequence, whereby the beam is caused to move through the coarse step in a number of fine steps equal to the number of pairs of elements of the array. Beam steering unit 30 is therefore required to produce for a single elevation scan from 0 to 15 degrees a number of command words amounting to (number of element pairs)×(coarse steps/degrees)×(total scan degrees) = 19×3.82×15≅1140. Also, to prevent accumulation of errors, in a technique known as phase cycling, a particular constant is added to each command word for successive scans until thirty-two scans have been completed, thereby further increasing the number of command words by a factor of thirty-two, making a total of 36,480 command words to be verified for accuracy.

An obvious method of verifying the command word output of beam steering unit 30 would be to store a set of test words duplicating the command words and to compare the test and command words, word by word as they are output by the beam steering unit. Such a method would require approximately 300 K bits of memory capacity for verifying operation of the elevation scan and a still greater amount of memory capacity for verifying the azimuth scan. The cyclic redundancy check monitor next to be described verifies both the data content and proper order of appearance of each command word output of the beam steering unit, while requiring storage capacity for only about 158 8-bit check words for the elevation scan in the specific MLS described.

Figure 2:
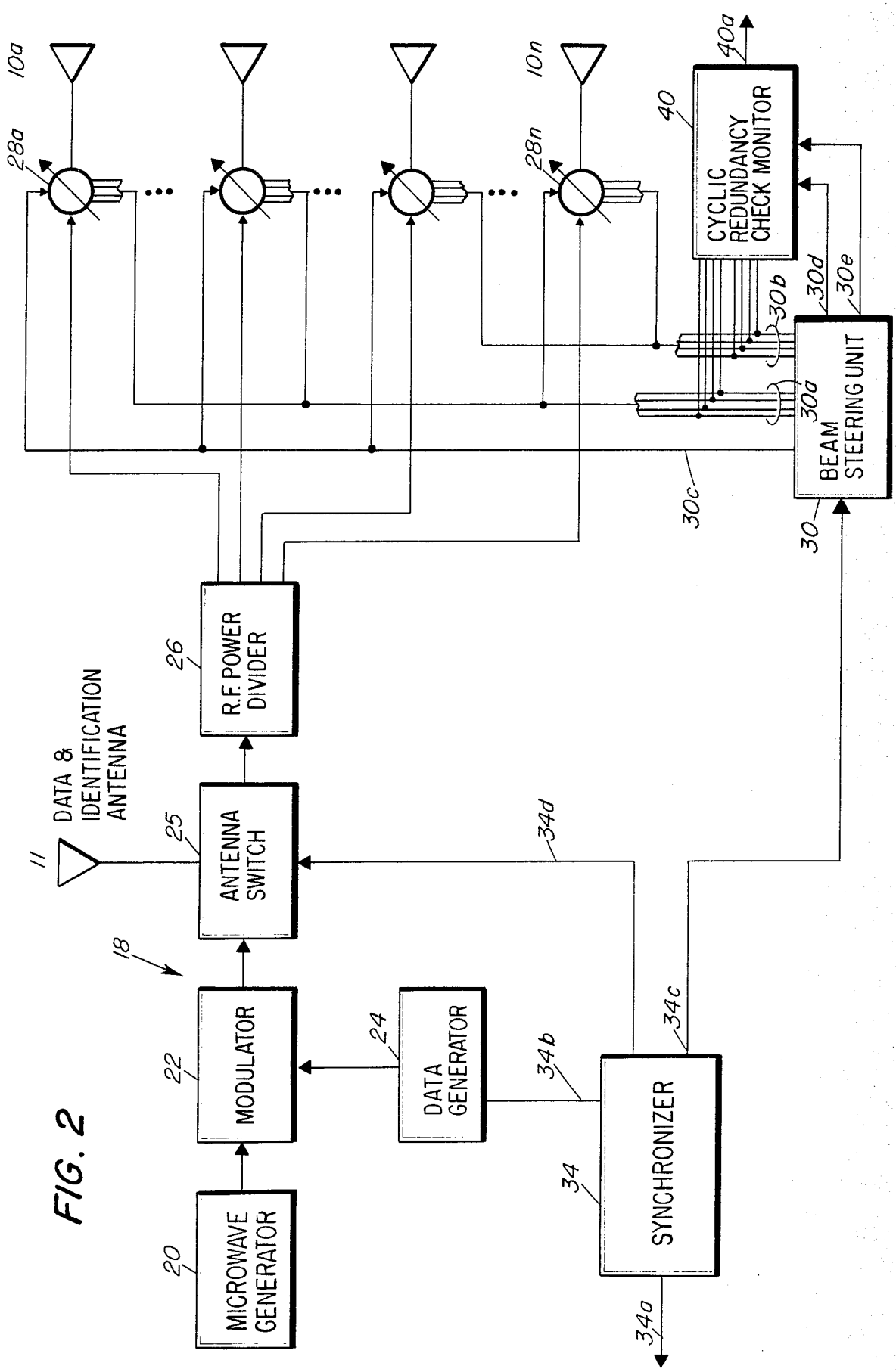
FIG. 2 is a block diagram of the microwave landing system elevation antenna including the cyclic redundancy check monitor of the invention.
Figure 3:
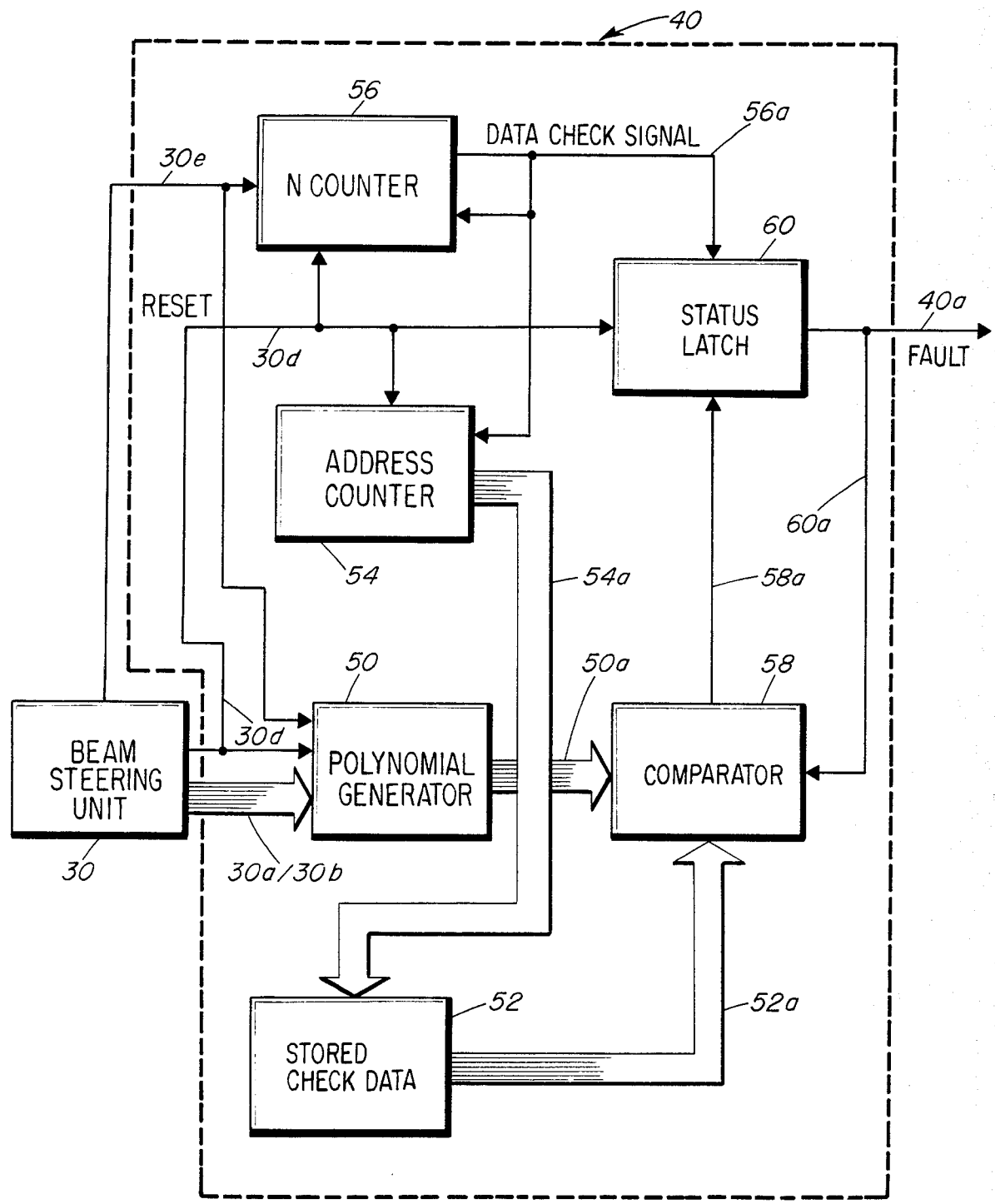
FIG. 3 is a block diagram which shows the invention in greater detail.

Referring to FIG. 3 the beam steering unit 30, also seen in FIG. 2, applies the digital command words via bus 30a/30b to cyclic redundancy check monitor 40 as they are generated by the beam steering unit. Cyclic redundancy check monitor 40 comprises, in part, a polynomial generator 50 which includes a latch and an array of Exclusive OR gates for summing, modulo 2, terms of the current word on data bus 30a/30b with results of a previous operation. As will be explained below, with reference to FIG. 4, data in generator 50 is then shifted once towards the most significant bit and appropriate feedback terms are summed with the result. The resulting sum, which is the output of polynomial 20 generator 50, is retained in a latch to be used in a similar operation with the next command word output of beam steering unit 30. After N command words on line 30a/30b have been received by generator 50, the output of generator 50 is compared with a check word called up from stored check data unit 52 which is suitably constituted by a read-only memory (ROM).

An address counter 54 is reset to an initial count by a signal on line 30d from beam steering unit 30 at some predetermined time, such as at the start of a beam scan. Address counter 54 is incremented by data check signals on line 56a to generate a new address signal on bus 54a for storage locations in stored check data unit 52 so that stored predetermined check words are produced on bus 52a as data check signals are periodically produced on line 56a during a beam scan cycle. The check word called up from unit 52 is compared with the output of polynomial generator 50 in an 8-bit comparator 58. Comparator 58 generates a "false" signal on line 58a when the word on bus 50a is not identical to the word on bus 52a. Otherwise, the signal on line 58a indicates there is no fault. Generally, until the appearance of a data check signal on line 56a, the word on bus 50a does not match the word on bus 52a so the signal on line 58a will be "false" for the majority of the command words input to generator 50.

At the end of each command word output, beam steering unit 30 generates a control signal on line 30e. This control signal is applied to N counter 56 and to polynomial generator 50. When counter 56 has accumulated a count of N such control signals, a data check signal appears momentarily at the output thereof which is applied by line 56a to a status latch 60, to address counter 54 and internally to counter 56 to reset the same. Although the output signal on line 58a may have been "false" during N−1 command word outputs from beam steering unit 30, the line 58a signal must be "true" for the Nth command word if all N command words have been correctly produced by the beam steering unit. If any one of such N command words have been in error, a "false" signal will be present on line 58a at the time data check signal occurs on line 56a. Status latch 60, enabled by the data check signal, retains a "false" signal if any is present on line 58a for the Nth command word, and signals a fault condition on line 40a. The presence of a fault signal on line 40a, through line 60a, disables comparator 58 from further "true" comparisons during the remainder of the beam scan cycle.

Figure 4:
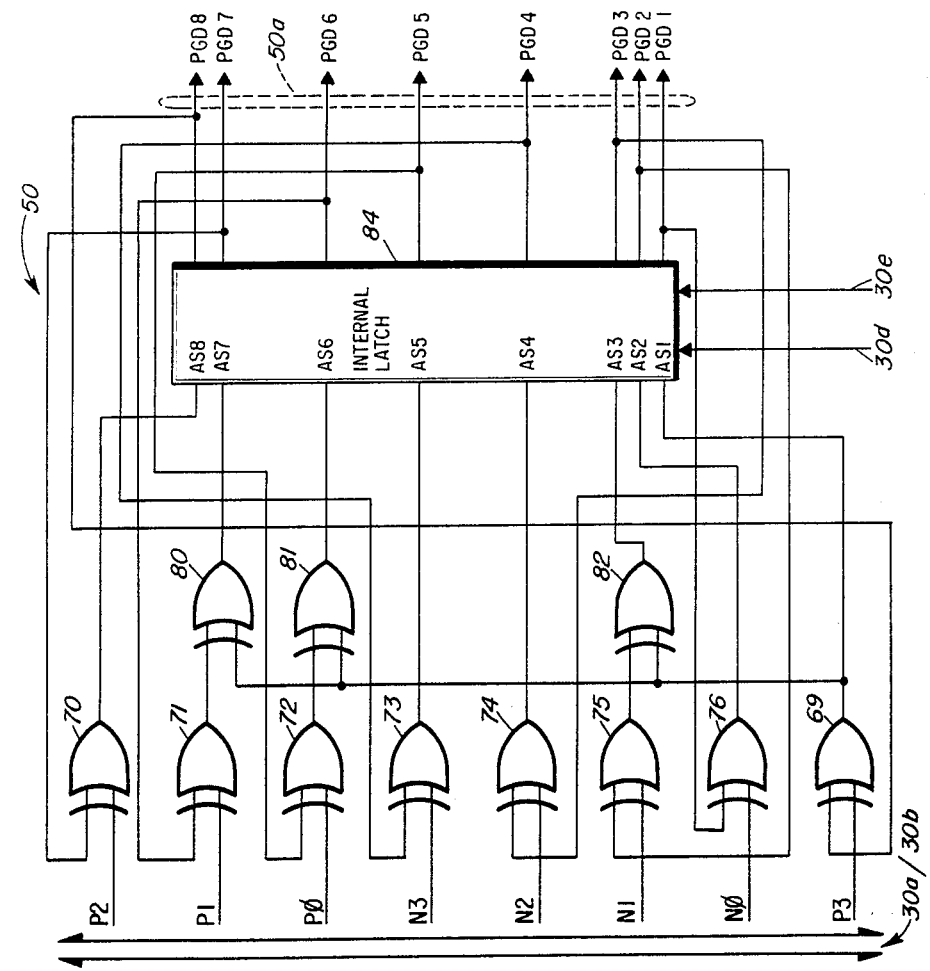
FIG. 4 is a block diagram which shows the polynomial generator embodiment used with this invention.

Referring now to FIG. 4, which shows polynomial generator 50 in greater detail, the generator consists of the eight Exclusive OR gates 69 to 76 which respectively receive as one input thereto the digits of the command words on lines 30a and 30b, that is, the digits P3 to P∅ and N3 to N∅. The respective second input to gates 69 to 76 are the digits of the check word stored in an internal latch 84, with the stored most significant bit, or bit PGD8, being combined in Exclusive OR gate 69 with the most significant or P3 bit from bus 30a, and the stored least significant bit, or bit PGD1, being combined in Exclusive OR gate 76 with the least significant or N∅ bit from bus 30b. The outputs of gates 71, 72 and 75 are applied respectively to Exclusive OR gates 80, 81 and 82. The output from gates 70, 73, 74, 76 and 69 are applied respectively to the AS8, AS5, AS4, AS2 and the AS1 inputs of the internal latch 84, where AS1 is the least significant and AS8 is the most significant bit position.

Internal latch 84 also receives signals on lines 30d and 30e. The signal at line 30d is a reset signal and is generated by the beam steering unit of FIG. 2 at the beginning of an elevation scan. The signal at line 30e is a strobe signal generated by beam steering unit 30 at the word repetition rate. This latter signal latches the word present at the input bit positions AS1 through AS8 into output lines PGD1 through PGD8, respectively, for use in the operation next occurring.

The theory of operation of polynomial generator 50 is derived from techniques previously developed in connection with error detecting and correcting codes used in digital data transmission systems. An informative paper on such codes appears in an article entitled "Cyclic Codes for Error Detection" by Peterson and Brown appearing in Proceedings of the IRE, Jan. 1961, pp. 228-235.

To produce such a code, a digital message, expressed as a polynomial G(X), is multiplied by a factor $X^{n-k}$. The product $X^{n-k}G(X)$ is divided by a generator polynomial P(X) to produce a quotient Q(X) and a remainder R(X). The message transmitted F(X) is the sum of $X^{n-k}G(X)$ and the remainder R(X). At the receiver, F(X) is divided by the generator polynomial P(X) and the remainder of such division will be zero if the transmission has been error free. Expressed algebraically:

$$\frac{X^{n-k}G(X)}{P(X)} = Q(X) + \frac{R(X)}{P(X)}$$

$F(X) = X^{n-k}G(X) + R(X)$, the transmitted message.

At the receiver, $$\frac{F(X)}{P(X)} = \frac{X^{n-k}G(X)}{P(X)} + \frac{R(X)}{P(X)}, \text{ but}$$

$$\frac{X^{n-k}G(X)}{P(X)} = Q(X) + \frac{R(X)}{P(X)} \text{ therefore}$$

$$\frac{F(X)}{P(X)} = Q(X) + \frac{R(X)}{P(X)} + \frac{R(X)}{P(X)} = Q(X) = 0$$

since the addition is modulo 2.

Such codes provide not only for the detection of certain 10 errors at the receiver but also for the correction of such errors. They require, however, an increase, by the amount of $X^{n-k}$, in the number of digits which must be transmitted to convey the message G(X).

The present invention is concerned with reducing the storage capacity required in order to detect the presence of an error in a long series of predetermined data words. In order to accomplish this, use is made only of the remainders, which are the check words referred to in the description of FIGS. 3 and 4, after division of the command words by a selected generator polynomial P(X).

The command word P3 . . . N∅ is an 8-digit word which may be written as a polynomial G(X), as follows:

$$G(X) = X^7 + X^6 + X^5 + X^4 + X^3 + X^2X + 1,$$

in which the highest degree of X is $X^7$ and the coefficients of each of the terms thereof may be 1 or 0, depending on the command word. For example, the command word P3 . . . N∅ = 11010101 =

$$G(X) = 1X^7 + 1X^6 + 0X^5 + 1X^4 + 0X^3 + 1X^2 + 0X + 1.$$

The selected generator polynomial P(X) is:

$$P(X) = X^8 + X^6 + X^5 + X^2 + 1,$$

in which the highest degree of X is $X^8$. Therefore, G(X) is not wholly divisible by P(X). However, if the coefficient of the $X^7$ term of G(X) is 1, the product of X·G(X) produces a polynomial of degree $X^8$ which is divisible by P(X), either evenly or with remainder. Such remainders, constituting the check words of the invention, are of degree $X^7$ or less and can be stored in the 8-bit latch 84, of FIG. 4. Up to 256 such check words can be created without encountering ambiguity.

Implementation of the check word generation process is simplified in FIG. 4 by the following:

Let P(X)=0, then $$X^8 + X^6 + X^5 + X^2 + 1 = 0, \text{ and}$$

$$X^8 = X^6 + X^5 + X^2 + 1, \text{ since } -X^8 = X^8, \text{ mod } 2.$$

The product XG(X) is formed by shifting G(X) once toward the most significant bit. Whenever the coefficient of the $X^7$ term of G(X) is "1", evidenced by "1" at the output of gate 69, the product polynomial XG(X) is divided by P(X). This is accomplished by summing, mod 2, P(X)=

$$1X^6 + 1X^5 + 1X^2 + 1$$

with like terms of XG(X). Input terminals AS8 . . . AS1 of latch 84 correspond to the polynomial $X^7 + X^6 + X^5 + X^4 + X^3 + X^2 + X + 1$. The "1" output of gate 69 provides a "1" coefficient for the $X^6$, $X^5$ and $X^2$ terms of P(X), which are Exclusively ORed, respectively, in gates 80, 81 and 82 with the outputs of gates 71, 72 and 75 to provide $X^6$, $X^5$ and $X^2$ terms at latch input terminals AS7, AS6 and AS3. The output of gate 69 is supplied directly to latch input terminal AS1 to form the $X^0$ degree term of the check word polynomial.

It should be noted that the particular polynomial P(X) selected for the described embodiment of the invention is but one of many usable polynomials of degree $X^8$. Texts on the subject of error correcting codes list numerous polynomials satisfactory for use herein.

Figure 5:
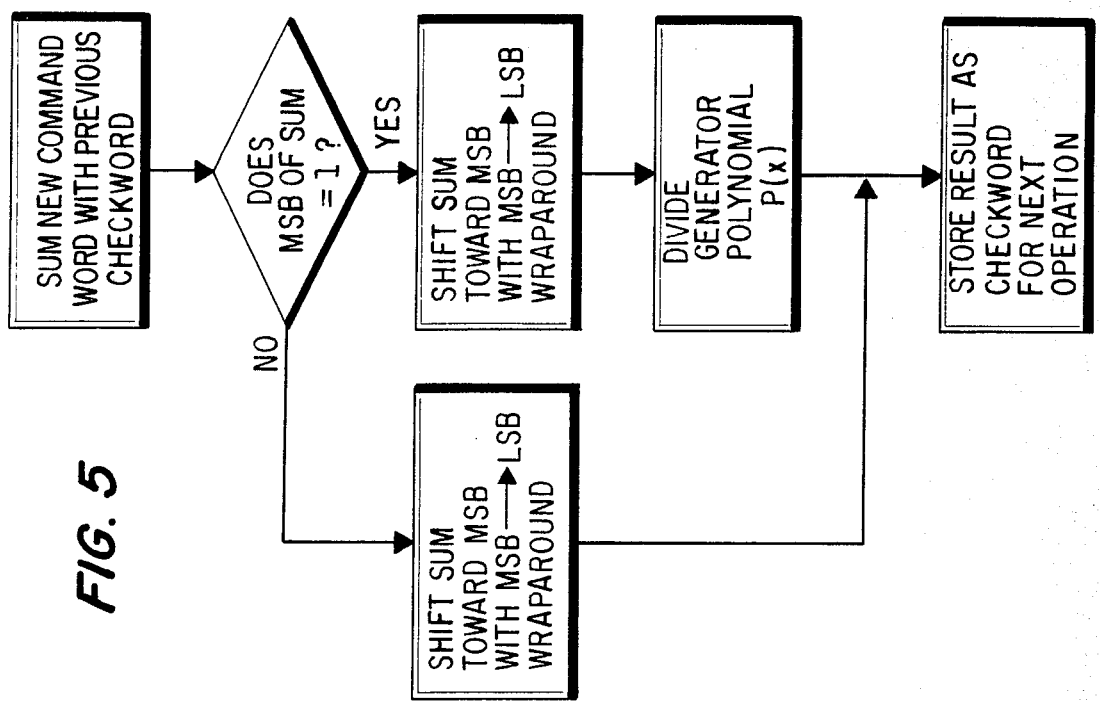
FIG. 5 is a logic flow diagram of the operation of the polynomial generator.

FIG. 5 is a flow chart summarizing operation of polynomial generator 50. As each command word appears on bus 30a/30b, it is summed, modulo 2, in gates 69-75, with the output of latch 84 present on terminals PGD1-PGD8. For the first command word of a scan cycle, the output of latch 84 will be 0000 0000, latch 84 having been cleared by the reset signal on line 30d. The sum is therefore equal to the first command word.

If the most significant bit of the first command word is "1," gate 69 supplies a "1" input to gates 80-82, thereby dividing the sum, which has been effectively multiplied by X by connecting the outputs of gates 69-75 to the next higher order inputs AS1-AS8 of latch 84, by the 30 generator polynomial P(X). The "1" input to gates 80-82 and directly to input terminal AS1 performs the division by adding the terms $X^6$, $X^5$, $X^2$ and 1 to like degree terms of the sum, producing a remainder which is the check word to be used as the addend for the second command word. The strobe signal on line 30e latches this remainder into terminals PGD1-PGD8, ready for the appearance of the second command word.

If the most significant bit of the first command word is not "1", the output of gate 69 is "0" so that the outputs of gates 71, 72 and 75 will pass through gates 80, 81 and 82 without alteration to appear, along with the outputs of gates 69, 70, 73, 74 and 76 at latch inputs AS1-AS8, with each term of the sum being effectively multiplied by X by virtue of the shifted connections to terminals AS1-AS8. The strobe signal on line 30e then latches the shifted sum word into output terminals for use as the addend with the second command word.

It should now be evident that the invention operates to reduce the storage capacity required to check the accuracy of a long train of command words by accumulating the remainders of the division of command word products by a particular polynomial. Each time the degree of such accumulated sum reaches the degree of the divisor polynomial, division is accomplished to produce a new remainder which is of a degree less than the divisor polynomial. The stored check words used for comparison with the output of the polynomial generator are never of higher degree than any of the command words and such stored check words need be called up for comparison only once for a train of data equal to N command words in length while preserving the ability to detect an error anywhere within said N command word data train.

The invention claimed is:

1. A cyclic redundancy check monitor for monitoring the accuracy of a train of command digital words applied to scanning antenna means in a microwave landing system to produce scanning motion of the beam of said antenna, comprising,
   means for storing a first polynomial;
   means receiving the command digital word currently applied to said antenna means and said first polynomial for providing the modulo 2 sum of said current command word and said first polynomial;
   means for increasing the degree of each tenm of said second polynomial;
   means for dividing said increased degree second polynomial by a predetermined generator polynomial whenever the highest degree term of said increased degree second polynomial is of the same degree as the highest degree tenm of said generator polynomial, said division producing a remainder polynomial;
   means for storing said remainder polynomial for use as said first polynomial upon the appearance of the command word next to follow said current command word;
   means for storing a predetermined check word;
   means for determining said remainder polynomial for each of a succession of N said command words;
   means for comparing said first polynomial stored after the appearance of the Nth said command word with said check word; and
   means for signaling non-agreement between said compared first polynomial and said check word.

2. A check monitor as claimed in claim 1, with additionally, addressable storage means for storing a plurality of said check words, each said check word being stored at an individual address; and address counter means incremented upon the appearance of each said Nth command word for retrieving from said addressable storage means a particular one of said stored check words for comparison with said first polynomial.

3. A check monitor as claimed in claim 1 wherein said means for providing the modulo 2 sum of said current command word and said first polynomial comprises, a plurality of Exclusive OR gates, each said gate providing at the output thereof the modulo 2 sum of terms of like degree of said command word and said first polynomial.

4. A check monitor as claimed in claim 3 wherein said means for storing said remainder polynomial comprises,
   latch means having a plurality of input terminals to which said remainder polynomial is applied in parallel format and having a plurality of output terminals at which said first polynomial appears in parallel format; and
   strobe signal means for said latch means, said strobe signal means causing said latch means to transfer digits present at said input terminals upon the appearance of said strobe signal to said output terminals, said latch means maintaining said digits at said output terminals until said strobe signal again appears.

* * * * *